(12) United States Patent
Chang Chien et al.

(10) Patent No.: US 11,211,321 B2
(45) Date of Patent: Dec. 28, 2021

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 17/099,802

(22) Filed: Nov. 17, 2020

(65) Prior Publication Data

US 2021/0202459 A1 Jul. 1, 2021

Related U.S. Application Data (60) Provisional application No. 62/955,456, filed on Dec. 31, 2019.

(51) Int. Cl.
*H01L 21/56* (2006.01)
*H01L 23/498* (2006.01)
(Continued)

(52) U.S. Cl.
CPC ...... *H01L 23/49838* (2013.01); *H01L 21/481* (2013.01); *H01L 21/4853* (2013.01); *H01L 21/4857* (2013.01); *H01L 21/56* (2013.01); *H01L 21/565* (2013.01); *H01L 21/568* (2013.01); *H01L 21/6835* (2013.01); *H01L 21/78* (2013.01); *H01L 23/16* (2013.01);
(Continued)

(58) Field of Classification Search
CPC ........... H01L 23/49838; H01L 21/4857; H01L 21/565; H01L 21/78; H01L 23/16; H01L 23/3128; H01L 23/3675; H01L 23/562; H01L 25/0655; H01L 21/56; H01L 23/31; H01L 23/49811; H01L 23/5385; H01L 23/5386; H01L 24/14; H01L 21/481; H01L 21/4853; H01L 23/24; H01L 23/49833; H01L 21/568; H01L 21/6835; H01L 24/05

See application file for complete search history.

(56) References Cited

U.S. PATENT DOCUMENTS

2017/0287874 A1 10/2017 Fang et al.

FOREIGN PATENT DOCUMENTS

| TW | 201916197 | 4/2019 |
|---|---|---|
| TW | 201916276 | 4/2019 |

*Primary Examiner* — Elias Ullah
(74) *Attorney, Agent, or Firm* — JCIPRNET (57) ABSTRACT

A package structure including a first chip, a second chip, a dielectric body, a third chip, an encapsulant, a first conductive terminal, and a circuit layer is provided. The dielectric body covers the first chip and the second chip. The third chip is disposed on the dielectric body such that a third active surface thereof faces a first active surface of the first chip or a second active surface of the second chip. The encapsulant covers the third chip. The first conductive terminal is disposed on the dielectric body and is opposite to the third chip. The circuit layer includes a first circuit portion and a second circuit portion. The first circuit portion penetrates the dielectric body. The first chip, the second chip, or the third chip is electrically connected to the first conductive terminal through the first circuit portion. The second circuit portion is embedded in the dielectric body.

17 Claims, 9 Drawing Sheets

(51) Int. Cl.
  *H01L 23/00* (2006.01)
  *H01L 25/18* (2006.01)
  *H01L 21/683* (2006.01)
  *H01L 25/065* (2006.01)
  *H01L 25/16* (2006.01)
  *H01L 25/00* (2006.01)
  *H01L 23/31* (2006.01)
  *H01L 23/538* (2006.01)
  *H01L 21/48* (2006.01)
  *H01L 23/24* (2006.01)
  *H01L 21/78* (2006.01)
  *H01L 23/16* (2006.01)
  *H01L 23/367* (2006.01)
  *H01L 23/552* (2006.01)

(52) U.S. Cl.
  CPC ............ *H01L 23/24* (2013.01); *H01L 23/31* (2013.01); *H01L 23/3128* (2013.01); *H01L 23/3675* (2013.01); *H01L 23/49811* (2013.01); *H01L 23/49816* (2013.01); *H01L 23/49822* (2013.01); *H01L 23/49833* (2013.01); *H01L 23/5385* (2013.01); *H01L 23/5386* (2013.01); *H01L 23/562* (2013.01); *H01L 24/05* (2013.01); *H01L 24/13* (2013.01); *H01L 24/14* (2013.01); *H01L 24/16* (2013.01); *H01L 24/17* (2013.01); *H01L 25/0652* (2013.01); *H01L 25/0655* (2013.01); *H01L 25/16* (2013.01); *H01L 25/18* (2013.01); *H01L 25/50* (2013.01); *H01L 21/561* (2013.01); *H01L 23/552* (2013.01); *H01L 2221/68359* (2013.01); *H01L 2224/02311* (2013.01); *H01L 2224/02313* (2013.01); *H01L 2224/02379* (2013.01); *H01L 2224/02381* (2013.01); *H01L 2224/13024* (2013.01); *H01L 2224/16145* (2013.01); *H01L 2224/16227* (2013.01); *H01L 2224/1716* (2013.01)

PACKAGE STRUCTURE AND MANUFACTURING METHOD THEREOF

CROSS-REFERENCE TO RELATED APPLICATION

This application claims the priority benefit of U.S. provisional application Ser. No. 62/955,456, filed on Dec. 31, 2019. The entirety of the above-mentioned patent application is hereby incorporated by reference herein and made a part of this specification.

BACKGROUND

Technical Field

The disclosure relates to a package structure and a manufacturing method thereof, and particularly relates to a package structure having a plurality of chips and a manufacturing method thereof.

Description of Related Art

In recent years, electronic devices have become increasingly important to people's life. In order to accelerate integration of various functions, a plurality of active chips may be integrated into one package structure. Therefore, how to improve the quality or efficiency of signal transmission between the multiple chips has become an urgent issue to be solved.

SUMMARY

The disclosure is directed to a package structure and a manufacturing method thereof, which provide better signal transmission quality or efficiency between a plurality of chips.

The disclosure provides a package structure including a first chip, a second chip, a dielectric body, a third chip, an encapsulant, a first conductive terminal, and a circuit layer. The first chip has a first active surface. The second chip has a second active surface. The dielectric body covers the first chip and the second chip. The third chip has a third active surface, and the third chip is disposed on the dielectric body in a way that the third active surface faces the first active surface or the second active surface. The encapsulant covers the third chip. The first conductive terminal is disposed on the dielectric body and is opposite to the third chip. The circuit layer includes a first circuit portion and a second circuit portion. The first circuit portion penetrates through the dielectric body, and the first chip, the second chip, or the third chip is electrically connected to the first conductive terminal through the first circuit portion. The second circuit portion is embedded in the dielectric body, and the first chip or the second chip is electrically connected to the third chip through the second circuit portion.

The disclosure provides a manufacturing method of a package structure including following steps. A first chip and a second chip are disposed on a carrier. A dielectric body having a plurality of first dielectric openings and a plurality of second dielectric openings is formed on the carrier, wherein the first dielectric openings penetrate through the dielectric body, and the second dielectric openings expose a portion of the first chip or a portion of the second chip. A circuit layer is formed on the dielectric body, and the circuit layer is filled in the first dielectric openings and the second dielectric openings. A third chip is disposed on the carrier, and the third chip is electrically connected to the first chip and the second chip through the circuit layer. An encapsulant covering the third chip is formed on the carrier, and a portion of the encapsulant is further filled in the first dielectric openings. The carrier is removed to at least expose a portion of the circuit layer. A first conductive terminal electrically connected to the circuit layer is formed.

Based on the above description, the package structure of the disclosure is capable of providing better quality or efficiency in signal transmission between multiple chips (such as the third chip and the first chip; or the third chip and the second chip) at least through the second circuit portion embedded in the dielectric body. Moreover, better quality or efficiency in signal transmission between the chip (for example, at least one of the first chip, the second chip and the third chip) and the first conductive terminal is provided at least through the first circuit portion penetrating through the dielectric body.

DESCRIPTION OF THE EMBODIMENTS

Directional terms used herein (for example, up, down, right, left, front, back, top, bottom) are only used as a reference of the drawings and are not intended to imply absolute orientations. Moreover, for clarity's sake, some of film layers or components may be omitted in the drawings.

Unless otherwise explicitly described, any method described herein is by no means intended to be interpreted as requiring to execute steps of the method in a particular order.

The disclosure may be explained more fully with reference to the drawings of the embodiments. However, the disclosure may also be embodied in various forms, and should not be limited to the embodiments described herein. Thicknesses, sizes or magnitudes of layers or regions in the drawings will be exaggerated for clarity's sake. The same or similar reference numbers indicate the same or similar components, which is not repeated in the following paragraphs.

FIG. 1A to FIG. 1I are partial cross-sectional schematic views of a part of a manufacturing method of a package structure according to a first embodiment of the disclosure. FIG. 1J is a cross-sectional schematic view of a package structure according to the first embodiment of the disclosure. FIG. 1K is a partial cross-sectional schematic view of the package structure according to the first embodiment of the disclosure. For example, FIG. 1K is an enlarged view of a region R1 in FIG. 1J.

Figure 1A:
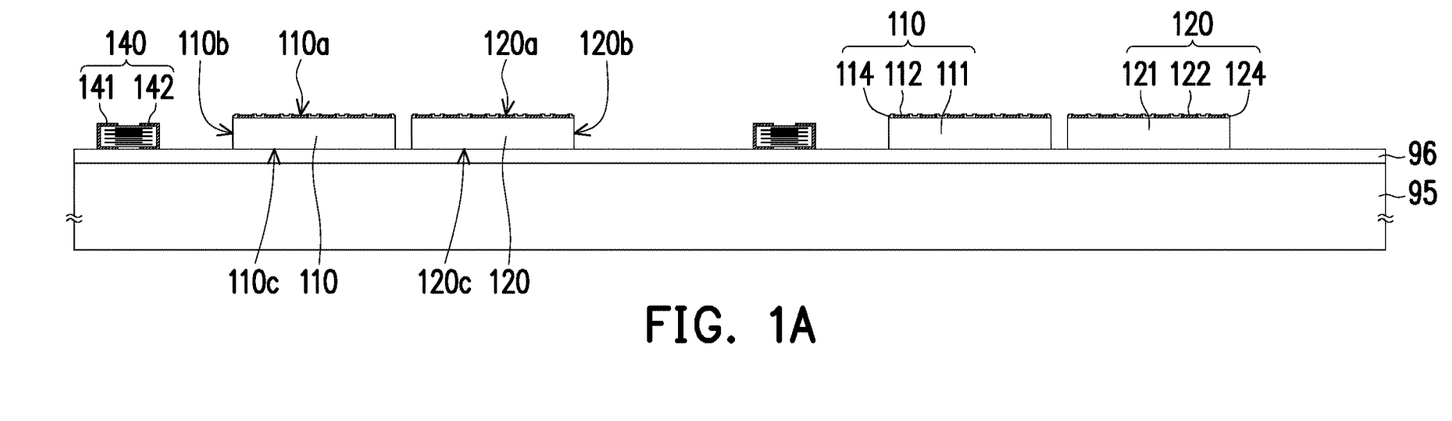
FIG. 1A to FIG. 1I are partial cross-sectional schematic views of a part of a manufacturing method of a package structure according to a first embodiment of the disclosure.

Referring to FIG. 1A, a first chip 110 and a second chip 120 are disposed on a first carrier 95. It should be noted that a sequence of disposing the first chip 110 and the second chip 120 on the first carrier 95 is not limited by the disclosure.

In an embodiment, the first carrier 95 may be made of glass, a wafer substrate, metal or other suitable materials as long as the above materials may carry structures or components formed thereon in subsequent manufacturing processes. Moreover, a number of the first chips 110 or the second chips 120 disposed on the first carrier 95 is not limited by the disclosure. Taking FIG. 1A as an example, the number of the first chips 110 disposed on the first carrier 95 is, for example, two, and the number of the second chips 120 disposed on the first carrier 95 is, for example, two.

In the embodiment, a release layer 96 may be formed on the first carrier 95. The release layer 96 may be a light to heat conversion (LTHC) adhesive layer, but the disclosure is not limited thereto.

In the embodiment, the first chip 110 may include a substrate 111, a plurality of first connection pads 112 and a first chip protection layer 114. One side of the substrate 111 has a device area (not shown), and a surface on which the device area is located may be referred to as a first active surface 110a. A surface opposite to the first active surface 110a may be referred to as a first back surface 110c. A surface connected between the first active surface 110a and the first back surface 110c may be referred to as a first side surface 110b. The first connection pads 112 may be disposed on the first active surface 110a. The first chip protection layer 114 may cover the first connection pads 112, and the first chip protection layer 114 exposes a portion of each first connection pad 112. In a general chip design, devices in the device area (for example, devices in the device area of the first chip 110) may be electrically connected to the corresponding connection pads (for example, a portion of the first connection pads 112 of the first chip 110) through a corresponding back end of line interconnect (BEOL interconnect).

In the embodiment, the first connection pads 112 are, for example, aluminum pads or copper pads, but the disclosure is not limited thereto.

In the embodiment, the second chip 120 may include a substrate 121, a plurality of second connection pads 122 and a second chip protection layer 124. One side of the substrate 121 has a device area (not shown), and a surface on which the device area is located may be referred to as a second active surface 120a. A surface opposite to the second active surface 120a may be referred to as a second back surface 120c. A surface connected between the second active surface 120a and the second back surface 120c may be referred to as a second side surface 120b.

In the embodiment, the second chip 120 may be the same as or similar to the first chip 110. For example, the substrate 121 may be the same as or similar to the substrate 111, the second connection pads 122 may be the same as or similar to the first connection pads 112, and the second chip protection layer 124 may be the same as or similar to the first chip protection layer 114, so that details thereof are not repeated.

Referring to FIG. 1A again, in the embodiment, a passive device 140 may be configured on the first carrier 95, but the disclosure is not limited thereto. The passive device 140 includes a first electrode 141 and a second electrode 142.

In an embodiment, the passive device 140 is, for example, a capacitor, but the disclosure is not limited thereto. For example, the passive device 140 may be a multilayer ceramic capacitor (MLCC).

Figure 1B:
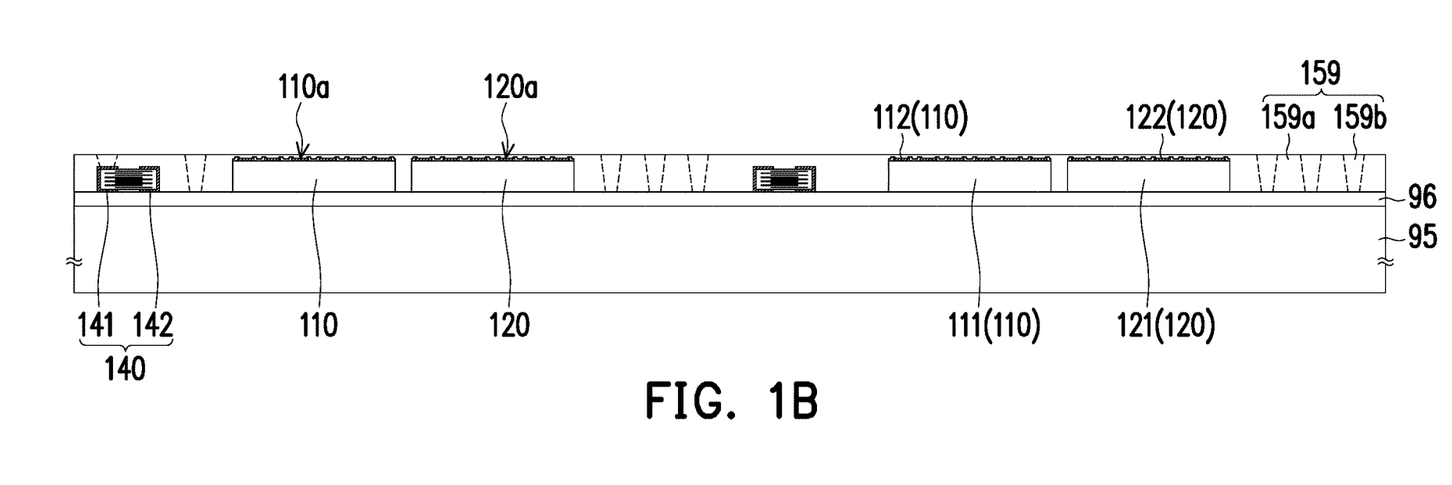
Figure 1C:
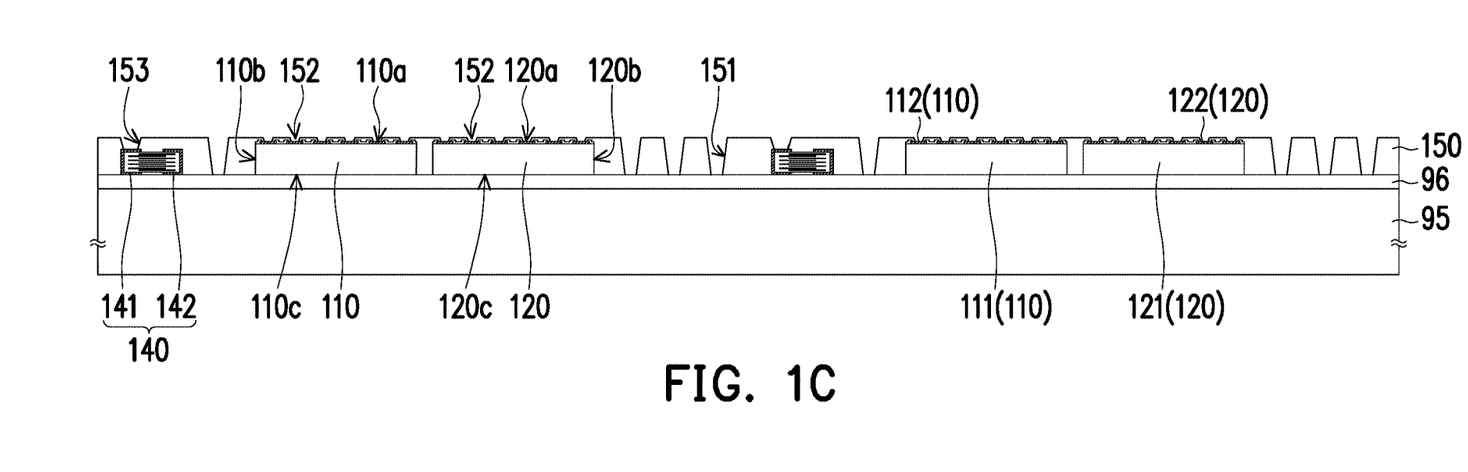

Referring to FIG. 1B to FIG. 1C, a dielectric body 150 having a plurality of first dielectric openings 151 and a plurality of second dielectric openings 152 is formed on the first carrier 95. The first dielectric openings 151 penetrate through the dielectric body 150. The second dielectric openings 152 expose a portion of the first chip 110 or a portion of the second chip 120.

In the embodiment, steps of forming the dielectric body 150 are as follows.

Referring to FIG. 1B, in the embodiment, a photoimageable dielectric material (PID material) 159 may be formed on the first carrier 95. The PID material 159 may cover the first active surface 110a of the first chip 110 and the second active surface 120a of the second chip 120. In an embodiment, the PID material 159 may be formed by a coating method or other suitable processes, but the disclosure is not limited thereto. In an embodiment, the PID material 159 may directly contact the first connection pads 112 of the first chip 110 and the second connection pads 122 of the second chip 120.

Referring to FIG. 1B to FIG. 1C, a portion of the PID material 159 may be cured. In addition, after curing the portion of the PID material 159, the remained uncured PID material 159 is removed.

For example, the PID material 159 (indicated in FIG. 1B) may have a first dielectric portion 159a (indicated in FIG. 1B) and a second dielectric portion 159b (indicated in FIG. 1B). The first dielectric portion 159a may be cured by photopolymerization and/or baking. Then, the uncured second dielectric portion 159b may be removed by wet cleaning or other suitable methods to pattern the cured first dielectric portion 159a, so as to form the dielectric body 150 (indicated in FIG. 1C) having a plurality of the first dielectric openings 151 (indicated in FIG. 1C) and a plurality of the second dielectric openings 152 (indicated in FIG. 1C). The dielectric body 150 may cover the first side surface 110b of the first chip 110 and a portion of the first active surface 110a. The dielectric body 150 may cover the second side surface 120b of the second chip 120 and a portion of the second active surface 120a. The first dielectric openings 151 may expose the first carrier 95 or a film layer on the first carrier 95 (for example, the release layer 96, if any). The second dielectric opening 152 may expose the first connection pads 112 of the first chip 110 or the second connection pads 122 of the second chip 120.

In the embodiment, the dielectric body 150 may have a third electric opening 153. A method of forming the third electric opening 153 may be the same or similar as that of the first dielectric opening 151 or the second dielectric opening 152, which is not repeated.

In the embodiment, the third dielectric opening 153 may expose a portion of the passive device 140, but the disclosure is not limited thereto. For example, the third dielectric opening 153 may expose the first electrode 141 of the passive device 140.

Figure 1D:
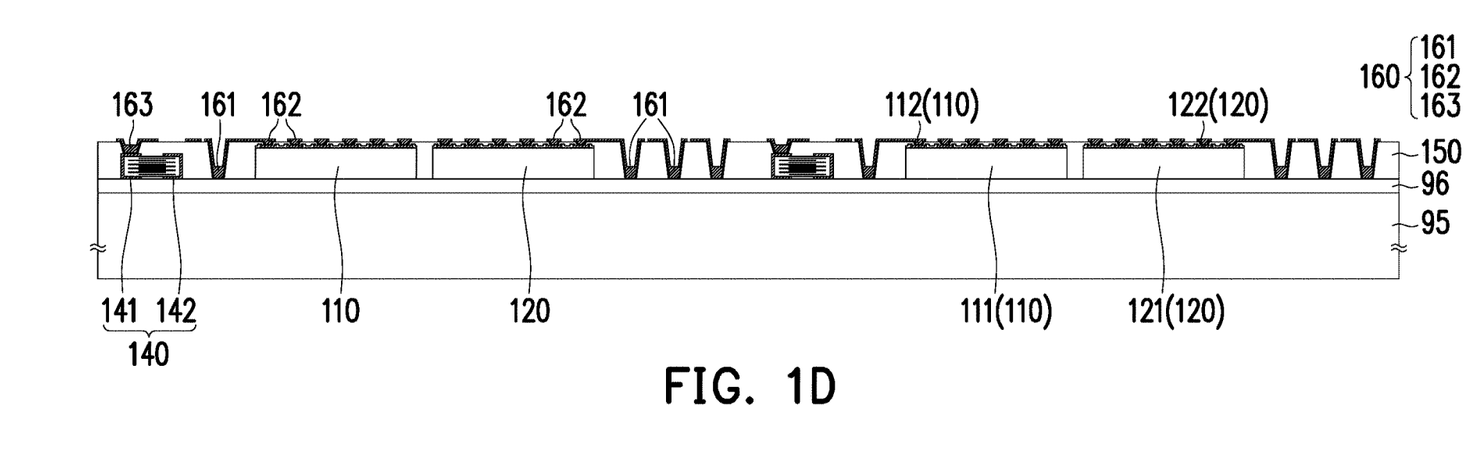

Referring to FIG. 1D, a circuit layer 160 is formed on the dielectric body 150. The circuit layer 160 may be filled in the first dielectric openings 151 (indicated in FIG. 1C) and the second dielectric openings 152 (indicated in FIG. 1C) of the dielectric body 150. In the embodiment, the circuit layer 160 may be further filled in the third electric opening 153 (indicated in FIG. 1C) of the dielectric body 150, but the disclosure is not limited thereto.

In the embodiment, the circuit layer 160 may be formed by a sputtering process, a photolithography process, an electroplating process, and/or an etching process, but the disclosure is not limited thereto. For example, a seed layer may be formed on a surface of the dielectric body 150 by a sputtering process. Then, a patterned photoresist layer may be formed on the seed layer by a lithography process. Then, a plating layer may be formed on a portion of the seed layer exposed by the patterned photoresist layer through an electroplating process. Then, the patterned photoresist layer and another portion of the seed layer that is not covered by the plating layer may be removed by an etching process. A patterned seed layer 167 (indicated in FIG. 1K) and a patterned plating layer 168 (indicated in FIG. 1K) disposed thereon may construct the patterned circuit layer 160.

In the embodiment, the circuit layer 160 may include a first circuit portion 161. The first circuit portion 161 may be disposed in the first dielectric openings 151 of the dielectric body 150, and the first circuit portion 161 may conformally cover bottoms and sidewalls of the first dielectric openings 151.

In the embodiment, the circuit layer 160 may include a second circuit portion 162. The second circuit portion 162 may be disposed in the second dielectric openings 152 of the dielectric body 150, and the second circuit portion 162 may be completely filled in a plurality of the second dielectric openings 152. Namely, the second circuit portion 162 may directly contact the first connection pads 112 of the first chip 110 or the second connection pads 122 of the second chip 120. For example, the patterned seed layer 167 belonging to the second circuit portion 162 may directly contact the first connection pads 112 of the first chip 110 or the second connection pads 122 of the second chip 120.

In the embodiment, the circuit layer 160 may further include a third circuit portion 163. The third circuit portion 163 may be disposed in the third dielectric opening 153 of the dielectric body 150, and the third circuit portion 163 may conformally cover a bottom and a sidewall of the third dielectric opening 153.

Figure 1E:
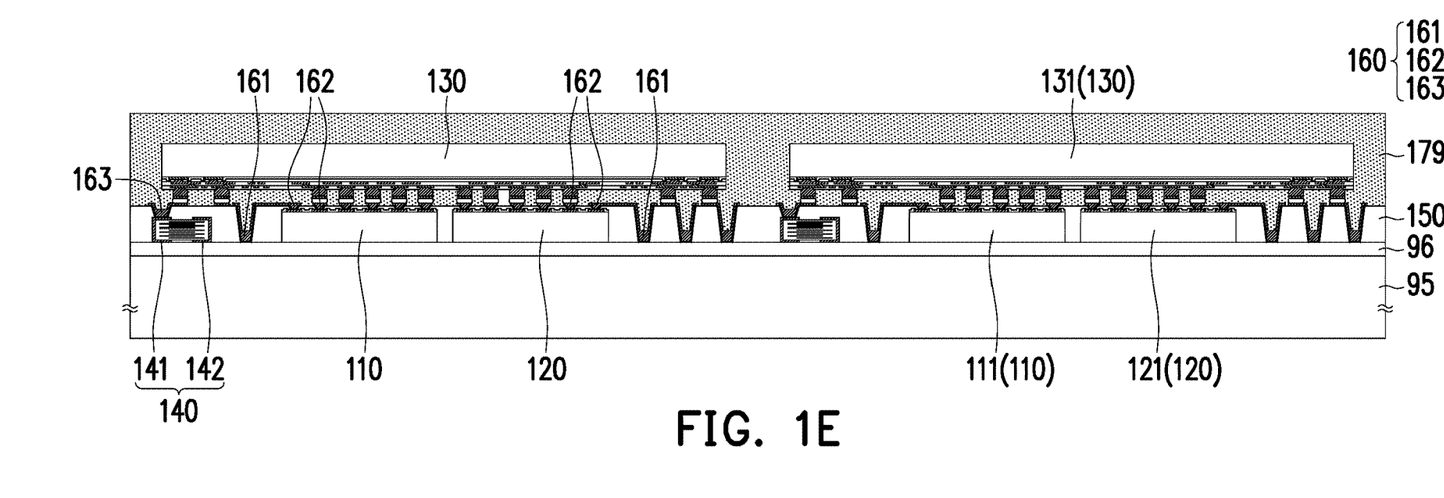

Referring to FIG. 1E, a third chip 130 is configured on the carrier. The third chip 130 is electrically connected to the first chip 110 and the second chip 120 through the circuit layer 160. For example, the second circuit portion 162 may be embedded in a portion of the dielectric body 150 disposed between the first chip 110 and the third chip 130 or between the second chip 120 and the third chip 130, and the third chip 130 may be electrically connected to the first chip 110 and the second chip 120 through the corresponding second circuit portion 162 in the circuit layer 160.

Figure 1F:
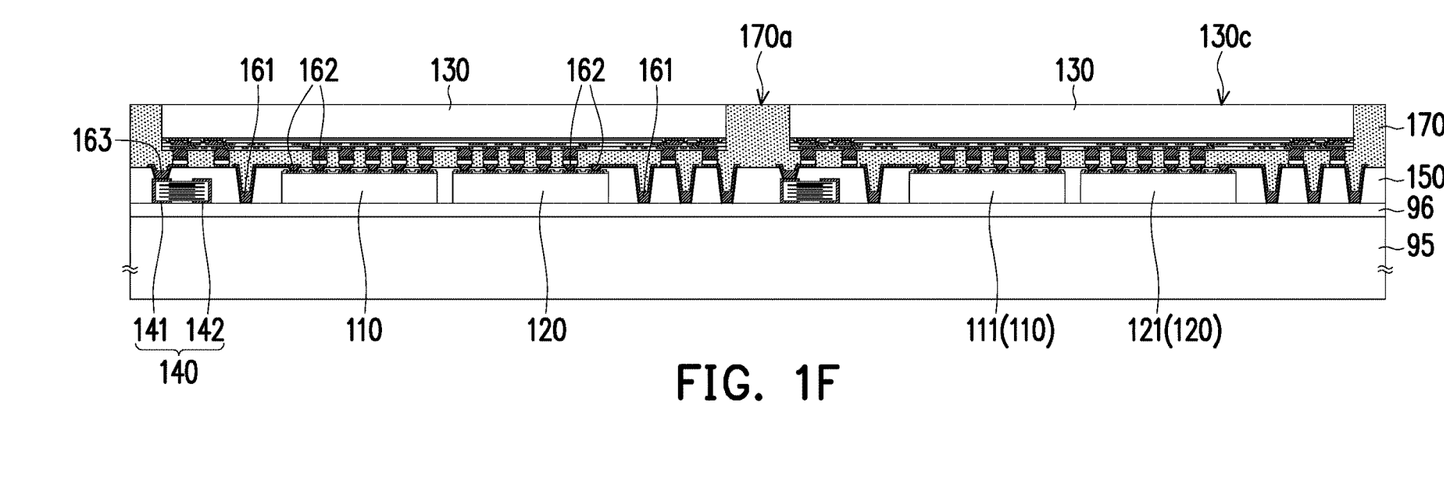

Referring to FIG. 1E to FIG. 1F, the encapsulant 170 covering the third chip 130 is formed on the carrier, and a portion of the encapsulant 170 may be filled or embedded in the first dielectric openings 151 (indicated in FIG. 1C). In the embodiment, a portion of an encapsulant 170 may be further filled in or embedded in the third dielectric opening 153 (indicated in FIG. 1C), but the disclosure is not limited thereto.

In an embodiment, the altitude at the bottommost of the portion of the encapsulant 170 filled or embedded in the first dielectric openings 151 is located between the first active surface 110a and the first back surface 110c, and/or between the second active surface 120a and the second back surface 120c.

In an embodiment, steps of forming the encapsulant 170 are, for example, as follows.

Referring to FIG. 1E, an encapsulant material 179 covering the third chip 130 may be formed, and a portion of the encapsulant material 179 may be filled in the first dielectric openings 151 (indicated in FIG. 1C). In an embodiment, the encapsulant material 179 is, for example, formed by first forming a molten molding compound on the carrier by using a molding process or other suitable method, and then cooling and curing the molten molding compound. In an embodiment, the third chip 130 is not exposed by the encapsulant material 179, but the disclosure is not limited thereto.

Referring to FIG. 1E to FIG. 1F, after the encapsulant material 179 is formed, a thinning process may be performed to remove a portion of the encapsulant material 179 to form the encapsulant 170 laterally covering the third chip 130 and exposing a third back surface 130c of the third chip 130.

In an embodiment, the thinning process, for example, includes chemical mechanical polishing (CMP), mechanical grinding, etching, or other suitable processes, but the disclosure is not limited thereto.

In an embodiment, after the above thinning process is performed, the third back surface 130c of the third chip 130 and an encapsulant top surface 170a of the encapsulant 170 may be substantially coplanar.

In an embodiment, in the above thinning process, a portion of the third chip 130 (for example, a portion of a substrate 131 of the third chip 130) may be slightly removed.

In the embodiment, the encapsulant 170 may directly contact or physically contact a portion of the dielectric body 150 or a portion of the circuit layer 160.

In the embodiment, a portion of the encapsulant 170 may be further disposed between the first chip 110 and the third chip 130 or between the second chip 120 and the third chip 130. For example, a portion of the encapsulant 170 may be disposed between the first chip 110 and the third chip 130, and/or a portion of the encapsulant 170 may be disposed between the second chip 120 and the third chip 130.

Figure 1G:
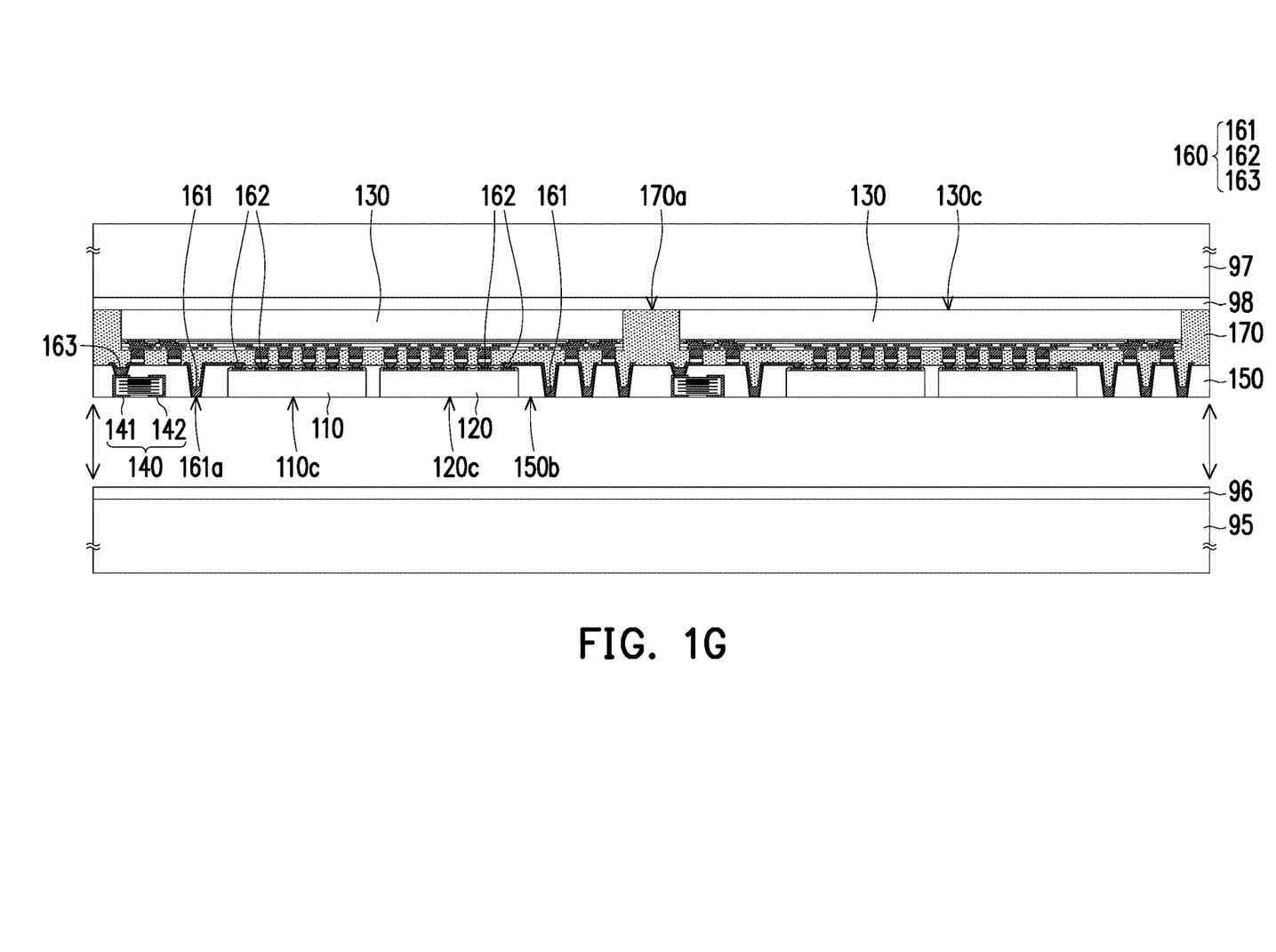

Referring to FIG. 1G, after the encapsulant is formed, the structure shown in FIG. 1F may be transferred to a second carrier 97 through carrier transfer bonding.

For example, the second carrier 97 may have a release layer 98 thereon. The second carrier 97 may be attached to the third back surface 130c of the third chip 130 or the encapsulant top surface 170a of the encapsulant 170 through the release layer 98. A material of the release layer 98 may be the same as or similar to the material of the release layer 96, which is not limited by the disclosure. Then, after the second carrier 97 is bonded to the third chip 130 or the encapsulant 170, the first carrier 95 may be removed. After the first carrier 95 is removed, a conductive surface 161a of the first circuit portion 161 of the circuit layer 160 may be exposed. In the embodiment, after the first carrier 95 is removed, the first back surface 110c of the first chip 110, the second back surface 120c of the second chip 120, or a dielectric surface 150b of the dielectric body 150 may be further exposed.

In an embodiment, the first back surface 110c of the first chip 110, the second back surface 120c of the second chip 120, the dielectric surface 150b of the dielectric body 150 and the conductive surface 161a of the first circuit portion 161 of the circuit layer 160 are substantially coplanar, but the disclosure is not limited thereto.

Figure 1H:
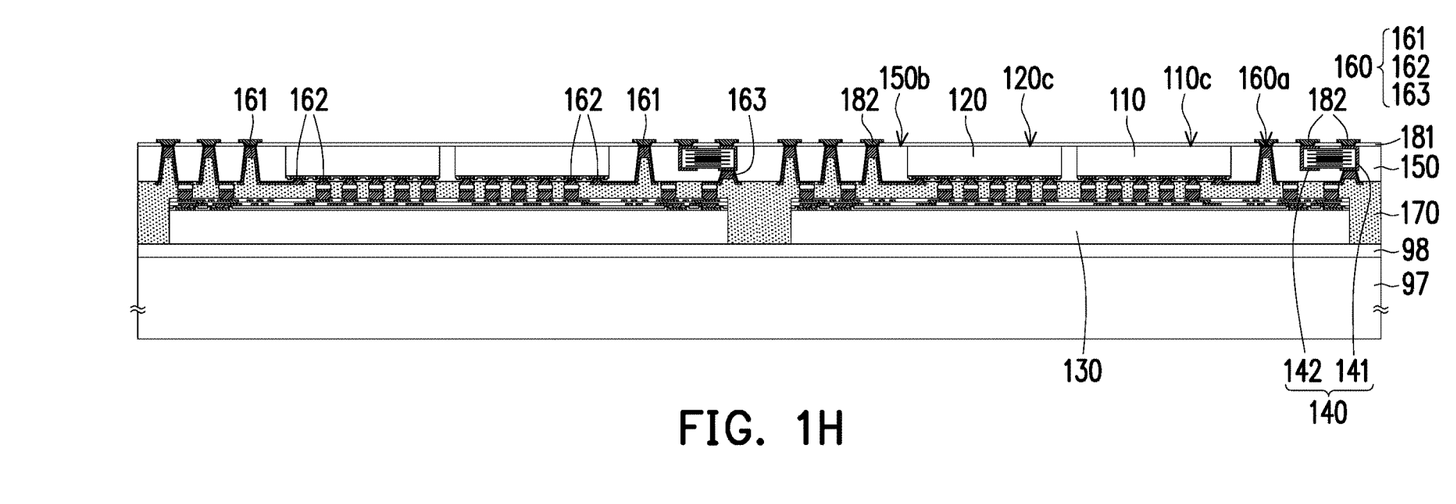

Referring to FIG. 1H, in the embodiment, after the first carrier 95 is removed, a protection layer 181 may be formed on the first back surface 110c of the first chip 110, the second back surface 120c of the second chip 120, or the dielectric surface 150b of the dielectric body 150. Then, a pad layer 182 may be formed on the protection layer 181. The pad layer 182 may be formed in the same or similar way as that of the circuit layer 160. The pad layer 182 may penetrate through the protection layer 181 and may be electrically connected to the first circuit portion 161 of the circuit layer 160.

In an embodiment, when/after the first carrier 95 is removed, a portion of the first circuit portion 161 may be slightly removed. For example, a portion of the material constituting the first circuit portion 161 may be removed (e.g., be peeled) when the first carrier 95 is removed. For example, a partially removing process (e.g., an etching process or a grinding process) may be performed after the first carrier 95 is removed, then, a portion of the first circuit portion 161 (e.g., a portion or all of the patterned seed layer) may be slightly removed.

In the embodiment, the pad layer 182 may directly contact or physically contact the first circuit portion 161. For example, the pad layer 182 may include a patterned seed layer 182a (indicated in FIG. 1K) and a patterned plating layer 182b (indicated in FIG. 1K). The patterned seed layer 182a may directly contact or physically contact the first circuit portion 161.

In an embodiment, the pad layer 182 and the first circuit portion 161 may have an interface there between. For example, the interface may be provided between the patterned seed layer 182a of the pad layer 182 and the first circuit portion 161. For example, the interface may be provided between the patterned seed layer 182a of the pad layer 182 and the patterned seed layer 167 (if any, indicated in FIG. 1K) constructing the first circuit portion 161. For example, the interface may be provided between the patterned seed layer 182a of the pad layer 182 and the patterned plating layer 168 (if all of the patterned seed layer is removed after the first carrier 95 is removed) constructing the first circuit portion 161.

Figure 1I:
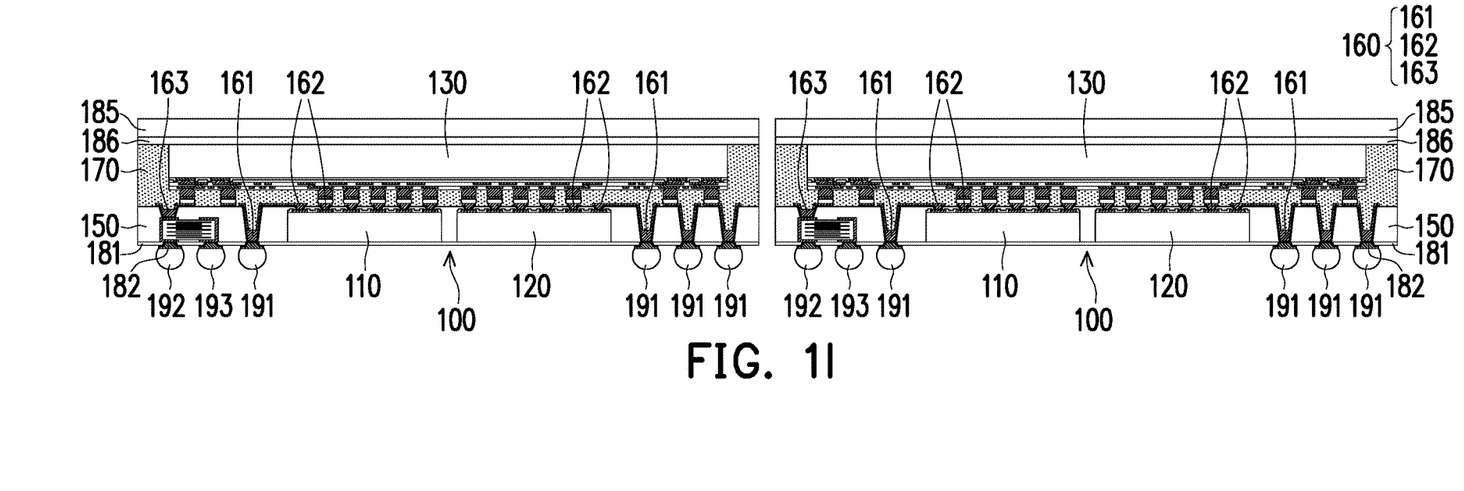
Figure 1J:
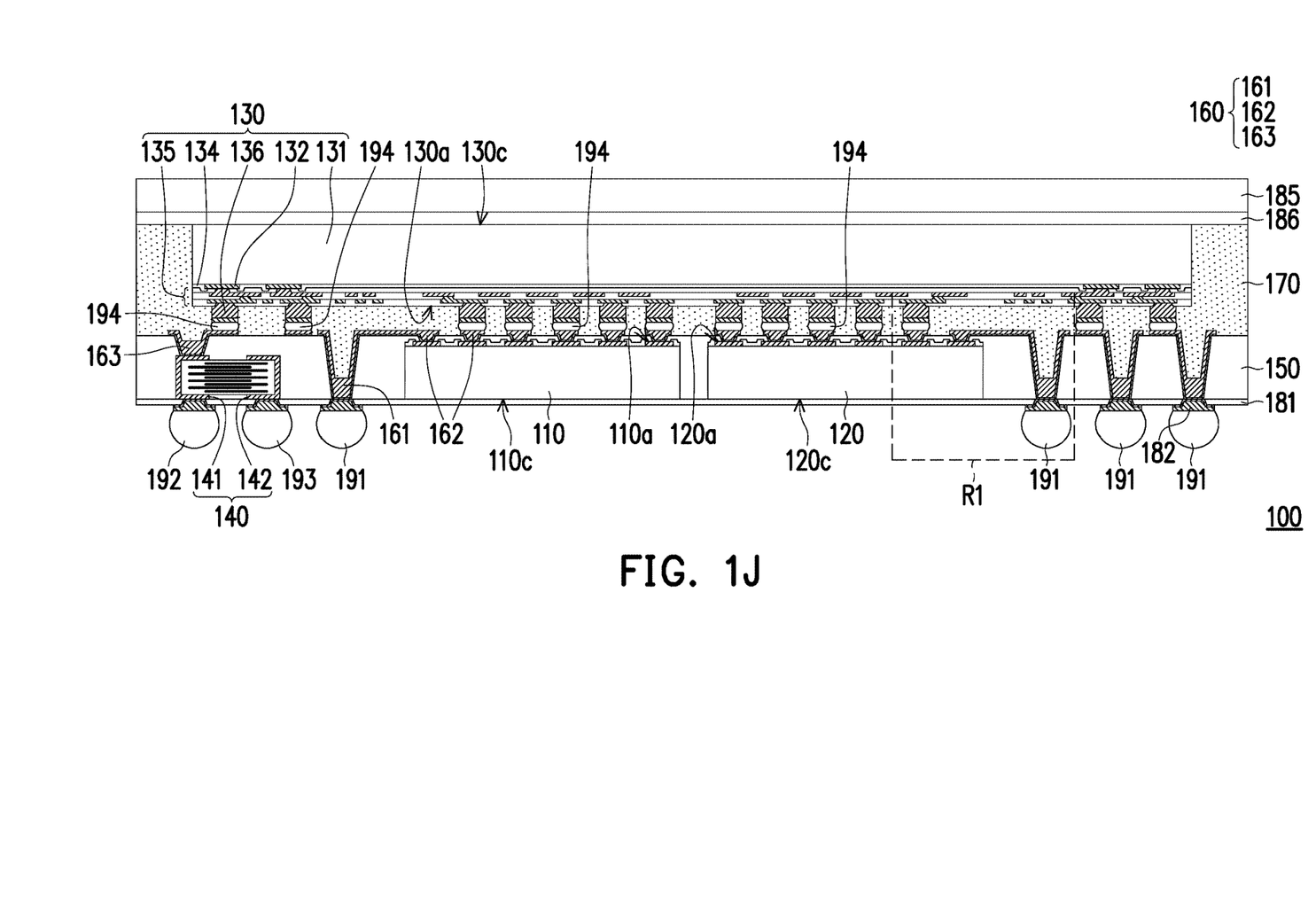
FIG. 1J is a cross-sectional schematic view of a package structure according to the first embodiment of the disclosure.
Figure 1K:
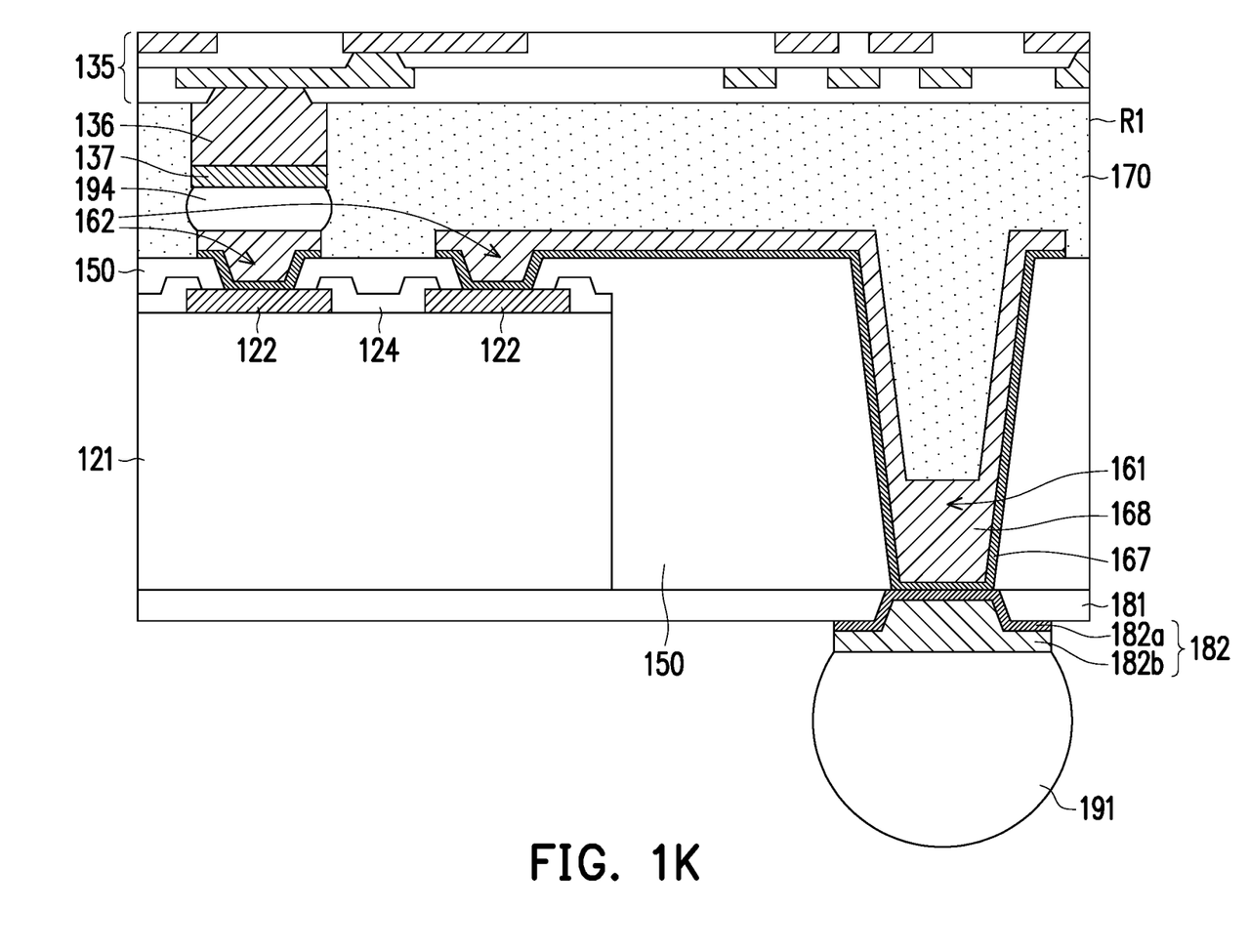
FIG. 1K is a partial cross-sectional schematic view of a package structure according to the first embodiment of the disclosure.

Referring to FIG. 1I, after the first carrier 95 is removed, a plurality of conductive terminals 191, 192 and 193 may be formed. The conductive terminals 191, 192 and 193 may be conductive pillars, solder balls, conductive bumps, or conductive terminals having other forms or shapes. The conductive terminals 191, 192 and 193 may be formed by electroplating, deposition, ball placement, reflow, and/or other suitable processes.

In the embodiment, the conductive terminals 191, 192 and 193 may include a first conductive terminal 191, a second conductive terminal 192, and/or a third conductive terminal 193. The first conductive terminal 191 may be electrically connected to the corresponding first circuit portion 161 in the circuit layer 160 through the corresponding pad layer 182. The second conductive terminal 192 may be electrically connected to the corresponding third circuit portion 163 in the circuit layer 160 through the corresponding pad layer 182.

Referring to FIG. 1H to FIG. 1I, in the embodiment, a plurality of package structures 100 may be formed through a singulation process. The singulation process may include, for example, a dicing process/cutting process to at least cut through the encapsulant 170.

It should be noted that after the singulation process is performed, similar component referential numbers may be used to the singulated components. For example, the first chip 110 (as shown in FIG. 1I) may be the first chip 110 (as shown in FIG. 1H) after singulation; the second chip 120 (as shown in FIG. 1I) may be the second chip 120 (as shown in FIG. 1H) after singulation; the dielectric body 150 (as shown in FIG. 1I) may be the dielectric body 150 (as shown in FIG. 1H) after singulation; the third chip 130 (as shown in FIG. 1I) may be the third chip 130 (as shown in FIG. 1H) after singulation; the encapsulant 170 (as shown in FIG. 1I) may be the encapsulant 170 (as shown in FIG. 1H) after singulation; the first conductive terminal 191 (as shown in FIG. 1I) may be the first conductive terminal 191 (as shown in FIG. 1H) after singulation; and the circuit layer 160 (as shown in FIG. 1I) may be the circuit layer 160 (as shown in FIG. 1H) after singulation, and so on. Other singulated components will follow the same referential numbers rules as above, which are not repeated or specifically described.

It should be noted that the disclosure does not limit an execution sequence of removing the second carrier 97 (if any), forming a plurality of the conductive terminals 191, 192 and 193, and performing the singulation process (if any).

In the embodiment, after the second carrier 97 is removed, a heat dissipation element 185 may be disposed on the third chip 130. The heat dissipation element 185 may be thermally coupled to the third chip 130. For example, the heat dissipation element 185 may be disposed on the third back surface 130c of the third chip 130, and a thermal interface material (TIM) 186 may be formed between the heat dissipation element 185 and the third chip 130.

After the above steps, manufacturing of the package structure 100 of the embodiment may be substantially completed.

Referring to FIG. 1J to FIG. 1K, the package structure 100 includes the first chip 110, the second chip 120, the dielectric body 150, the third chip 130, the encapsulant 170, the first conductive terminal 191, and the circuit layer 160. The first chip 110 has the first active surface 110a. The second chip 120 has the second active surface 120a. The dielectric body 150 covers the first chip 110 and the second chip 120. The encapsulant 170 covers the third chip 130. The first conductive terminal 191 is disposed on the dielectric body 150 and is opposite to the third chip 130. The circuit layer 160 includes a first circuit portion 161 and a second circuit portion 162. The first circuit portion 161 penetrates through the dielectric body 150. The first chip 110, the second chip 120, or the third chip 130 is electrically connected to the first conductive terminal 191 through the first circuit portion 161. The second circuit portion 162 is embedded in the dielectric body 150. The first chip 110 or the second chip 120 is electrically connected to the third chip 130 through the second circuit portion 162.

In the embodiment, the third chip 130 may include a substrate 131, a plurality of third connection pads 132, a third chip protection layer 134, a redistribution circuit structure 135, and a plurality of third chip connectors 136. The substrate 131 has a device area (not shown) on one side, and the surface on which the device area is located may be referred to as a third active surface 130a. The third chip 130 is disposed on the dielectric body 150 in a way that the third active surface 130a faces the first active surface 110a or the second active surface 120a. The redistribution circuit structure 135 is disposed on the third active surface 130a. The third chip connectors 136 are electrically connected to the corresponding third connection pads 132 through corresponding circuits in the redistribution circuit structure 135. The third chip connectors 136 may be formed by a lithography process, a sputtering process, an electroplating process, and/or an etching process; or the third chip connector 136 may include a pre-formed conductive pillar, which is not limited by the disclosure. In an embodiment, a conductive connection layer 137 may be formed on the third chip connectors 136.

In the embodiment, the package structure 100 may further include a passive device 140. The passive device 140 may be electrically connected to the third chip 130. For example, the passive device 140 may include the first electrode 141 and the second electrode 142, and the circuit layer 160 may further include the third circuit portion 163. The third circuit portion 163 may be embedded in the dielectric body 150. The first electrode 141 of the passive device 140 may be electrically connected to the third chip 130 through the third circuit portion 163 of the circuit layer 160.

In the embodiment, the dielectric body 150 may cover the passive device 140, but the disclosure is not limited thereto.

In physics, a homogeneous material may have almost the same properties at every point; it may be uniform without irregularities. In other words, a homogeneous material cannot split elements into different single materials by using a mechanical method (for example: manners such as breaking, shearing, cutting, sawing, and grinding).

In an embodiment, the dielectric body 150 may be a homogeneous material. In other words, the dielectric body 150 may not include an interface formed due to a different material or a different process.

In an embodiment, the encapsulant 170 may be a homogeneous material. In other words, the encapsulant 170 may not include an interface formed due to a different material or a different process.

In an embodiment, the dielectric body 150 may be a homogeneous material, and the encapsulant 170 may be another homogeneous material.

In the embodiment, the package structure 100 may further include a second conductive terminal 192. The second conductive terminal 192 is disposed on the dielectric body 150 and is opposite to the third chip 130. The second conductive terminal 192 may be electrically connected to the third chip 130 at least through the first electrode 141 of the passive device 140 and the corresponding third circuit portion 163 in the circuit layer 160 in sequence.

In the embodiment, the package structure 100 may further include a third conductive terminal 193. The third conductive terminal 193 is disposed on the dielectric body 150 and is opposite to the third chip 130. The third conductive terminal 193 may be electrically connected to the second electrode 142 of the passive device 140.

In the embodiment, the package structure 100 may further include a fourth conductive terminal 194. The third chip 130 may be electrically connected to the corresponding circuit portion in the circuit layer 160 through the corresponding fourth conductive terminal 194.

In the embodiment, the package structure 100 may further include a protection layer 181 and a pad layer 182. The protection layer 181 may be disposed on the dielectric surface 150b of the dielectric body 150 and cover the dielectric body 150. The pad layer 182 is disposed on the protection layer 181 and penetrates through the protection layer 181. The conductive terminal (such as the first conductive terminal 191 or the second conductive terminal 192) on the dielectric body 150 may be electrically connected to the corresponding circuit portion of the circuit layer 160 through the corresponding pad layer 182. For example, the first conductive terminal 191 may be electrically connected to the first chip 110 or the second chip 120 through the corresponding pad layer 182, the corresponding first circuit portion 161 in the circuit layer 160 and the corresponding second circuit portion 162 in the circuit layer 160. The second conductive terminal 192 may be electrically connected to the third chip 130 through the corresponding pad layer 182, the first electrode 141 of the passive device 140, and the third circuit portion 163.

In an embodiment, the first chip 110, the second chip 120, or the third chip 130 may be a power management integrated circuit (PMIC), a micro-electro-mechanical system (MEMS), or an application-specific integrated circuit (ASIC), an application processor (AP), dynamic random access memory (DRAM) chip, a static random access memory (SRAM) chip, a high bandwidth memory (HBM) chip, a system on chip (SoC) or other similar high performance computing (HPC) chips.

In an embodiment, the first chip 110 and the second chip 120 may be homogeneous chips, and the third chip 130 and the first chip 110/the second chip 120 may be heterogeneous chips, but the disclosure is not limited to thereto.

In the embodiment, a signal transmission distance between the third chip 130 and the first chip 110 is substantially the same as a physical distance between the third chip 130 and the first chip 110. For example, a signal between the third chip 130 and the first chip 110 may be transmitted through corresponding conductive members (for example, the corresponding fourth conductive terminal 194 and the corresponding second circuit portion 162 in the circuit layer 160), and the distance between the third wafer 130 and the first chip 110 is substantially equal to a height or thickness of the aforementioned conductive members (for example, a thickness of the corresponding fourth conductive terminal 194 and a thickness of the corresponding second circuit portion 162). In this way, quality and efficiency of signal transmission between the third chip 130 and the first chip 110 may be improved.

In the embodiment, a signal transmission distance between the third chip 130 and the second chip 120 is substantially the same as a physical distance between the third chip 130 and the second chip 120. For example, a signal between the third chip 130 and the second chip 120 may be transmitted through corresponding conductive members (for example, the corresponding fourth conductive terminal 194 and the corresponding second circuit portion 162 in the circuit layer 160), and the distance between the third chip 130 and the second chip 120 is substantially equal to a height or thickness of the aforementioned conductive members (for example, the thickness of the corresponding fourth conductive terminal 194 and the thickness of the corresponding second circuit portion 162). In this way, quality and efficiency of signal transmission between the third chip 130 and the second chip 120 may be improved.

In an embodiment, one of the second conductive terminal 192 and the third conductive terminal 193 may serve as a power terminal, and the other one of the second conductive terminal 192 and the third conductive terminal 193 may serve as a ground terminal.

For example, in terms of an application of the package structure 100, the second conductive terminal 192 may be electrically connected to a voltage source to serve as the power terminal, and the third conductive terminal 193 may be grounded to serve as the ground terminal. In this way, a voltage or power used to drive or enable the package structure 100 may be electrically connected to a corresponding chip (for example, the third chip 130, or further electrically connected to the first chip 110 or the second chip 120 by a circuit that is not shown in the cross-sectional views of the figures) sequentially through the second conductive terminal 192, the first electrode 141 of the passive device 140, and the corresponding third circuit portion 163 in the circuit layer 160. In this way, in the application of the package structure 100, by using the passive device 140, impact or damage of a surge to the first chip 110, the second chip 120 and/or the third chip 130 may be reduced, so as to reduce the damage of the package structure 100 or improve stability thereof.

For example, in terms of an application of the package structure 100, the second conductive terminal 192 may be grounded to serve as the ground terminal, and the third conductive terminal 193 may be electrically connected to a voltage source to serve as the power terminal. In this way, a voltage or power used to stabilize or reduce static electricity or leakage of the package structure 100 may be electrically connected to a corresponding chip (for example, the third chip 130, or further electrically connected to the first chip 110 or the second chip 120 by a circuit that is not shown in the cross-sectional views of the figures) sequentially through the second conductive terminal 192, the first electrode 141 of the passive device 140, and the corresponding third circuit portion 163 in the circuit layer 160. In this way, in the application of the package structure 100, by using the passive device 140, impact or damage of a surge to the first chip 110, the second chip 120 and/or the third chip 130 may be reduced, so as to reduce the damage of the package structure 100 or improve stability thereof.

In an embodiment, the passive device 140 may serve as a line filter or a noise filter, which is not limited by the disclosure.

In the embodiment, the package structure 100 may further include the heat dissipation element 185, but the disclosure is not limited thereto.

Figure 2:
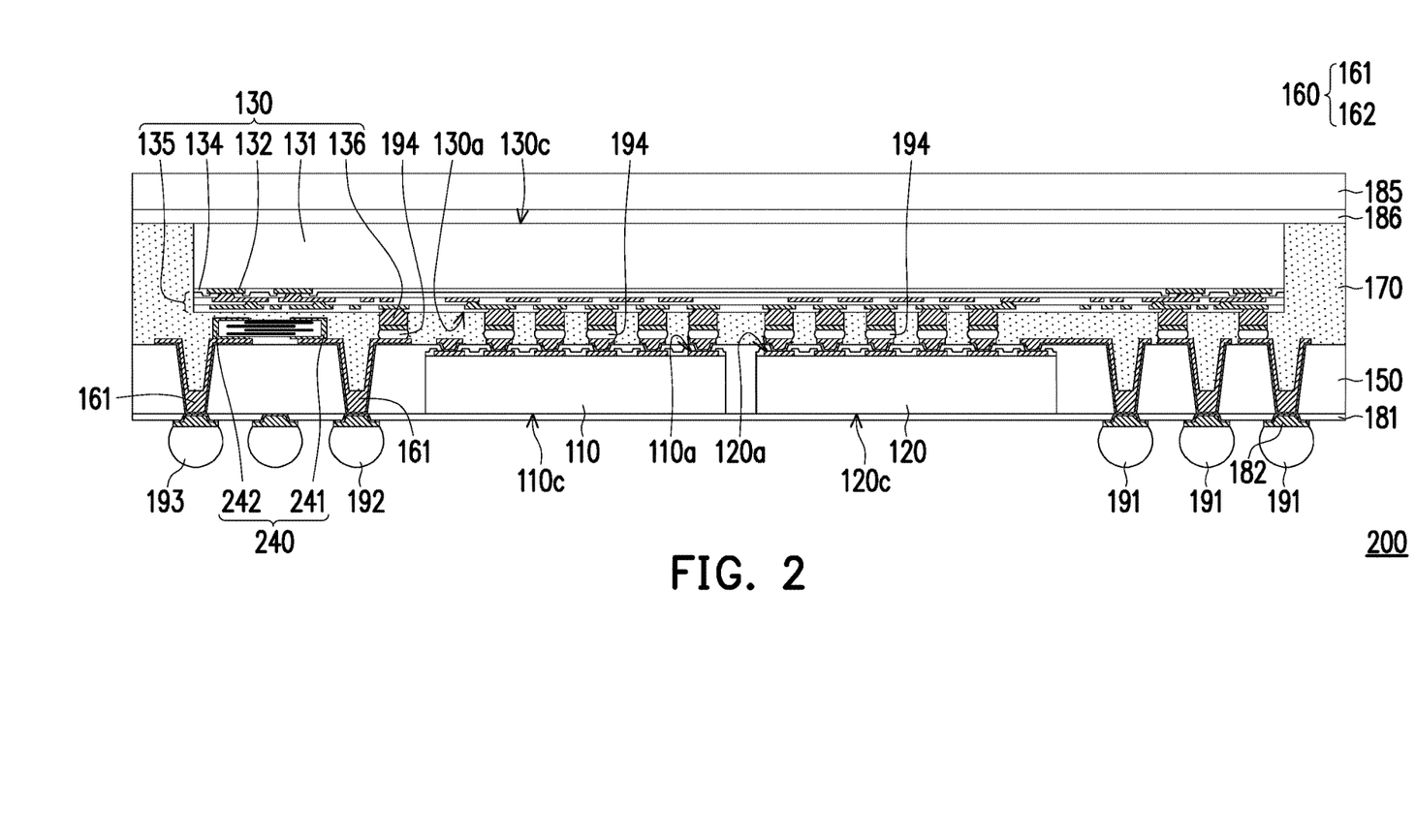
FIG. 2 is a cross-sectional schematic view of a package structure according to a second embodiment of the disclosure.

FIG. 2 is a cross-sectional schematic view of a package structure according to a second embodiment of the disclosure. The package structure of the second embodiment is similar to the package structure of the first embodiment, where similar components are denoted by the same reference numerals, and have similar functions, materials, or formation methods, and descriptions thereof are not repeated.

Referring to FIG. 2, in the embodiment, a package structure 200 includes the first chip 110, the second chip 120, the dielectric body 150, the third chip 130, the encapsulant 170, the first conductive terminal 191, the circuit layer 160, and a passive device 240. The passive device 240 may be electrically connected to the third chip 130. For example, the passive device 240 may include a first electrode 241 and a second electrode 242. The first electrode 241 of the passive device 240 may be electrically connected to the third chip 130 through the first circuit portion 161 of the circuit layer 160.

In the embodiment, the encapsulant 170 may cover the passive device 240, and the passive device 240 may be disposed between the third chip 130 and the dielectric body 150, but the disclosure is not limited thereto.

In terms of an application of the package structure 200, the second conductive terminal 192 may be electrically connected to a voltage source to serve as the power terminal, and the third conductive terminal 193 may be grounded to serve as the ground terminal; alternatively, the second conductive terminal 192 may be grounded to serve as the ground terminal, and the third conductive terminal 193 may be electrically connected to the voltage source to serve as the power terminal. In the application of the package structure 200, by using the passive device 240, impact or damage of a surge to the first chip 110, the second chip 120 and/or the third chip 130 may be reduced, so as to reduce the damage of the package structure 200 or improve stability thereof.

In an embodiment, the passive device 240 may serve as a line filter or a noise filter, which is not limited by the disclosure.

Figure 3:
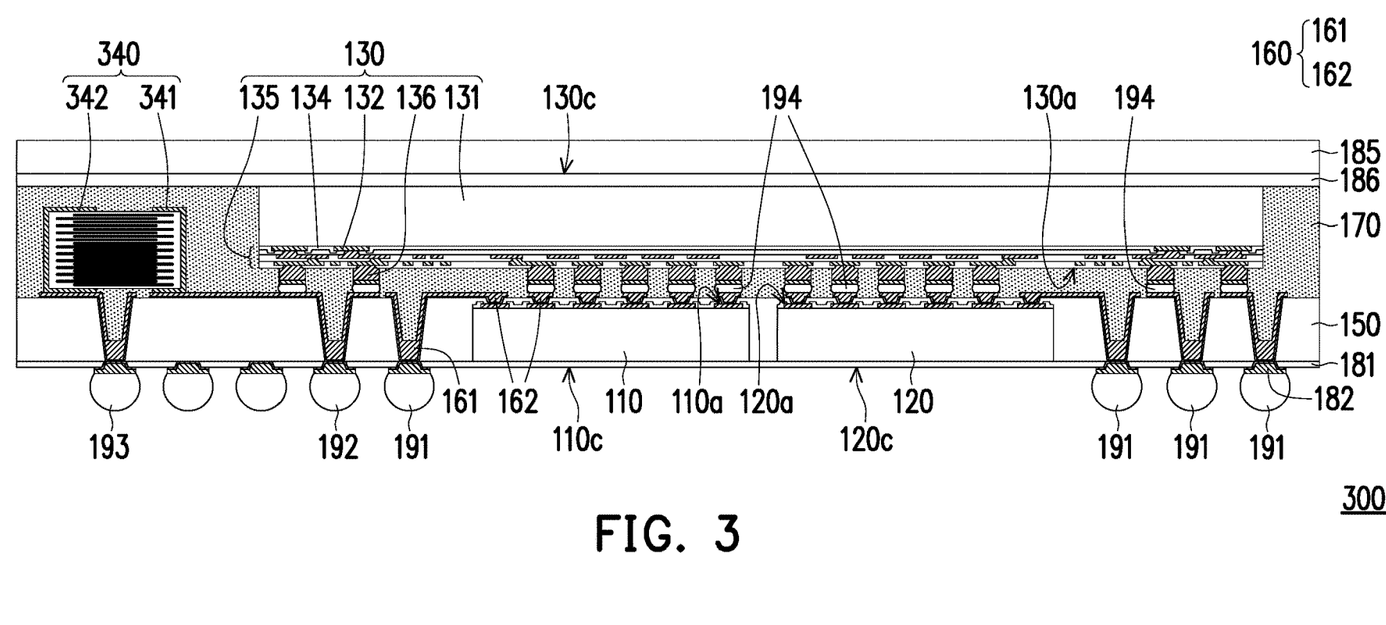
FIG. 3 is a cross-sectional schematic view of a package structure according to a third embodiment of the disclosure.

FIG. 3 is a cross-sectional schematic view of a package structure according to a third embodiment of the disclosure. The package structure of the third embodiment is similar to the package structure of the first embodiment, where similar components are denoted by the same reference numerals, and have similar functions, materials, or formation methods, and descriptions thereof are not repeated.

Referring to FIG. 3, in the embodiment, a package structure 300 includes the first chip 110, the second chip 120, the dielectric body 150, the third chip 130, the encapsulant 170, the first conductive terminal 191, the circuit layer 160, and a passive device 340. The passive device 340 may be electrically connected to the third chip 130. For example, the passive device 340 may include a first electrode 341 and a second electrode 342. The first electrode 341 of the passive device 340 may be electrically connected to the third chip 130 through the first circuit portion 161 of the circuit layer 160.

In the embodiment, the encapsulant 170 may cover the passive device 340, but the disclosure is not limited thereto.

In terms of an application of the package structure 300, the second conductive terminal 192 may be electrically connected to a voltage source to serve as the power terminal, and the third conductive terminal 193 may be grounded to serve as the ground terminal; alternatively, the second conductive terminal 192 may be grounded to serve as the ground terminal, and the third conductive terminal 193 may be electrically connected to the voltage source to serve as the power terminal. In the application of the package structure 300, by using the passive device 340, impact or damage of a surge to the first chip 110, the second chip 120 and/or the third chip 130 may be reduced, so as to reduce the damage of the package structure 300 or improve stability thereof.

In an embodiment, the passive device 340 may serve as a line filter or a noise filter, which is not limited by the disclosure.

In summary, the package structure of the disclosure is capable of providing better quality or efficiency in signal transmission between multiple chips (such as the third chip and the first chip; or the third chip and the second chip) at least through the second circuit portion embedded in the dielectric body. Moreover, better quality or efficiency in signal transmission between the chip (for example, at least one of the first chip, the second chip and the third chip) and the first conductive terminal is provided at least through the first circuit portion penetrating through the dielectric body.

What is claimed is:
1. A package structure, comprising:
a first chip, having a first active surface;
a second chip, having a second active surface;
a dielectric body, covering the first chip and the second chip;
a third chip, having a third active surface, and the third chip being disposed on the dielectric body in a way that the third active surface faces the first active surface or the second active surface;
an encapsulant, covering the third chip;
a first conductive terminal, disposed on the dielectric body and opposite to the third chip; and
a circuit layer, comprising a first circuit portion and a second circuit portion, wherein
the first circuit portion penetrates through the dielectric body, and the first chip, the second chip, or the third chip is electrically connected to the first conductive terminal through the first circuit portion; and
the second circuit portion is embedded in the dielectric body, and the first chip or the second chip is electrically connected to the third chip through the second circuit portion.
2. The package structure as claimed in claim 1, wherein the encapsulant directly contacts the dielectric body.

3. The package structure as claimed in claim 1, wherein a portion of the encapsulant is further embedded in the dielectric body.

4. The package structure as claimed in claim 1, wherein a portion of the dielectric body is further disposed between the first chip and the third chip, or disposed between the second chip and the third chip.

5. The package structure as claimed in claim 1, wherein the dielectric body has a first dielectric opening, and the first circuit portion and a portion of the encapsulant are further disposed in the first dielectric opening.

6. The package structure as claimed in claim 1, wherein a portion of the encapsulant is further disposed between the first chip and the third chip, or disposed between the second chip and the third chip.

7. The package structure as claimed in claim 1, wherein
the first chip comprises a first connection pad and a first chip protection layer on the first active surface, and the first chip protection layer exposes a portion of the first connection pad;
the second chip comprises a second connection pad and a second chip protection layer on the second active surface, and the second chip protection layer exposes a portion of the second connection pad; and
the second circuit portion directly contacts the first connection pad or the second connection pad.

8. The package structure as claimed in claim 1, wherein
the first chip further has a first back surface opposite to the first active surface;
the second chip further has a second back surface opposite to the second active surface;
the dielectric body has a dielectric surface;
the first circuit portion of the circuit layer has a conductive surface; and
the first back surface, the second back surface, the dielectric surface and the conductive surface are substantially coplanar.

9. The package structure as claimed in claim 1, further comprising:
a second conductive terminal, disposed on the dielectric body and opposite to the third chip; and
a passive device, comprising a first electrode, wherein:
the circuit layer further comprises a third circuit portion embedded in the dielectric body; and
the third circuit portion is electrically connected to the first electrode of the passive device, the third chip and the second conductive terminal.

10. The package structure as claimed in claim 9, wherein the dielectric body further has a third dielectric opening, and the third circuit portion and a portion of the encapsulant are further disposed in the third dielectric opening.

11. The package structure as claimed in claim 1, further comprising:
a protection layer, covering the dielectric body;
a pad layer, disposed on the protection layer and penetrates through the protection layer, and the first conductive terminal is electrically connected to the first circuit portion through the pad layer.

12. The package structure as claimed in claim 11, wherein the pad layer and the first circuit portion have an interface therebetween.

13. A manufacturing method of a package structure, comprising:
disposing a first chip and a second chip on a carrier;
forming a dielectric body having a plurality of first dielectric openings and a plurality of second dielectric openings on the carrier, wherein the plurality of first dielectric openings penetrate through the dielectric body, and the plurality of second dielectric openings expose a portion of the first chip or a portion of the second chip;
forming a circuit layer on the dielectric body, wherein the circuit layer is filled in the plurality of first dielectric openings and the plurality of second dielectric openings;
disposing a third chip on the carrier, wherein the third chip is electrically connected to the first chip and the second chip through the circuit layer;
forming an encapsulant covering the third chip on the carrier, wherein a portion of the encapsulant is further filled in the plurality of first dielectric openings;
removing the carrier to at least expose a portion of the circuit layer; and
forming a first conductive terminal electrically connected to the circuit layer.

14. The manufacturing method of the package structure as claimed in claim 13, wherein the circuit layer is completely filled in the plurality of second dielectric openings.

15. The manufacturing method of the package structure as claimed in claim 13, wherein the first chip has a first active surface, the second chip has a second active surface, and steps of forming the dielectric body comprise:
forming a photoimageable dielectric material covering the first active surface and the second active surface on the carrier, wherein the photoimageable dielectric material has a first dielectric portion and a second dielectric portion;
curing the first dielectric portion; and
removing the uncured second dielectric portion after the first dielectric portion is cured, so as to form the dielectric body having the plurality of first dielectric openings and the plurality of second dielectric openings.

16. The manufacturing method of the package structure as claimed in claim 15, wherein
the first chip comprises a first connection pad disposed on the first active surface;
the second chip comprises a second connection pad disposed on the second active surface; and
the photoimageable dielectric material directly contacts the first connection pad and the second connection pad.

17. The manufacturing method of the package structure as claimed in claim 13, wherein steps of forming the encapsulant comprise:
forming an encapsulant material covering the third chip on the carrier, wherein a portion of the encapsulant material is further filled in the plurality of first dielectric openings; and
removing a portion of the encapsulant material to expose a portion of the third chip.

* * * * *